United States Patent [19]
Sauthier

[11] 3,800,233
[45] Mar. 26, 1974

[54] ADJUSTABLE FREQUENCY PULSE GENERATOR

[75] Inventor: Pierre Sauthier, Bienne, Switzerland

[73] Assignee: Omega Louis Brandt & Frere, S.A., Canton of Berne, City of Bienne, Switzerland

[22] Filed: July 7, 1972

[21] Appl. No.: 269,617

[30] Foreign Application Priority Data
July 16, 1971 Great Britain .................... 33553/71

[52] U.S. Cl. ........................ 328/49, 328/42, 328/48, 307/218
[51] Int. Cl. ............................................ H03k 21/36
[58] Field of Search .......... 328/48, 42, 49; 307/223, 307/224, 225, 218

[56] References Cited
UNITED STATES PATENTS

| | | | |
|---|---|---|---|
| 3,202,837 | 8/1965 | Baracket | 307/224 R |
| 3,393,366 | 7/1968 | Shoop | 328/48 |
| 3,540,207 | 11/1970 | Keeler | 58/23 R |
| 3,548,203 | 12/1970 | Basse et al. | 307/225 R |

*Primary Examiner*—John S. Heyman
*Attorney, Agent, or Firm*—Pennie & Edmonds

[57] ABSTRACT

In a pulse generator such as may be used in crystal controlled electronic time pieces, comprising an oscillator circuit coupled to a chain of successive frequency divider stages, to obtain output pulses substantially lower in frequency than the oscillator frequency, means are provided to periodically and temporarily bypass one of the frequency divider stages. The frequency correction made by such bypass arrangement may serve to correct for the error in oscillation frequency of a crystal controlling the oscillator circuit when such crystal is purposely ground to oscillate at slightly below a desired precise rate.

10 Claims, 3 Drawing Figures

ADJUSTABLE FREQUENCY PULSE GENERATOR

FIELD OF THE INVENTION

This invention concerns pulse generators of the type whose frequency may be controlled by a quartz crystal. In particular a typical pulse generator of the type under consideration will provide an oscillator operating at a relatively high frequency the output of which is connected to a sequence of divider stages so that a succession of pulses at a desired lower frequency is obtained at the output of the last in the sequence of divider stages.

Such arrangements may be usefully employed, inter alia, in timekeeping instruments such as watches and clocks, and there exist already various proposals to so employ them. In principle a crystal controlled watch or clock should prove to be an accurate instrument indeed. One problem which arises however is the difficulty of adjusting exactly the frequency of the crystal during manufacture. This is compounded by the effects of ageing and temperature variation on the crystal frequency.

If it should be desired to manufacture watches in quantity at a reasonable cost utilizing such crystals, it is clear that the crystals themselves must not cost too much. But the high precision required is not readily obtained. It has been the practice in known proposals to provide a frequency adjusting trimmer capacitor in order to correct deficiencies stemming from the crystal. One problem here arises from the size of the capacitor required to have an appreciable effect on the frequency, particularly where it is necessary that all components including power supply and display arrangement be mounted within the volume encompassed by a watch casing.

Another possible solution is suggested by U. S. Pat. No. 3,540,207 in which an inhibit circuit is controlled from the output of the pulse generator and serves to block pulses from the oscillator at predetermined intervals.

The present invention proposes the use of crystals which may initially be cut to run at a frequency lower than the normal design frequency and to effect a coarse adjustment by means of a by-passing arrangement applicable to one of the divider stages. For fine adjustments a trimmer may be used but since only a fine adjustment is required the trimmer may be kept small.

STATEMENT OF THE INVENTION

Accordingly, the invention provides, in a pulse generator comprising an oscillator circuit the output of which is coupled to a chain of successive frequency divider stages by which output pulses are obtained at a desired frequency lower than the oscillator frequency, the improvement comprising a normally disabled or open bypass circuit bypassing at least one of said divider stages, control means for enabling or closing said bypass circuit and for concurrently interrupting or disabling the coupling of the bypassed divider stage to the succeeding stages of the chain, and means for feeding the output of at least one divider stage later in the chain than said bypassed stage to the control means at preselectable time intervals, thereby enabling said control means to periodically temporarily remove said bypassed stage from the chain and so to increase the output frequency of the chain. Said time intervals advantageously are determined by the rate of change of state of at least one of the divider stages late in the chain. Selector switch means may be provided to select one of a plurality of such late stages, so as to be able to adjust the time intervals according to the output of the selected stage. The bypass circuit may with advantage include a plurality of logic gates, and a bistable circuit may then provide enabling signals of predetermined duration to the logic gates. Other features of the invention will be apparent from the following description.

DESCRIPTION OF THE DRAWINGS

In order that a better understanding of the invention may be had, reference will now be made to the accompanying drawings in which.

DETAILED DESCRIPTION OF THE INVENTION

Figure 1:
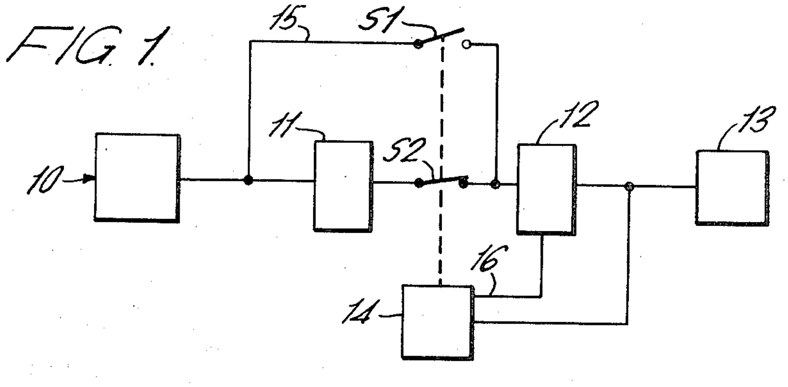
FIG. 1 is a block diagram of the basic logic.

In FIG. 1 block 10 represents an oscillator which may for example provide an output at a nominal frequency of 16,384 hz. This output is fed to a first binary counter or divider stage 11; and a bypass circuit 15,S1.

The output of the first divider stage 11 is fed via normally closed switch S2 to a further chain of divider stages 12. The bypass circuit which comprises line 15 and normally open switch S1 is also connected into the chain of divider stages 12. The output of the chain 12 is used to drive the display unit 13 and is also connected to a correction control circuit 14. Correction control circuit 14 provides an output which determines the position of switches S1 and S2. It will be noted that these switches occupy complementary positions, i.e., when S2 is closed S1 is open and vice versa. Normally S2 will be closed.

As pulses from the oscillator pass through the chain of divider stages, at each successive stage this frequency is halved. Thus if the oscillator frequency is 16,384 hz and it is desired to have an input frequency of 1 hz to the display unit 13 then 14 divider stages will be required. The display unit may for example be provided with a step by step electric motor which in response to the output of the last divider stage, advances an indicator by one step each second.

It will be realized that with a crystal nominally designed to oscillate at a frequency of 16,384 hz, an error of 1 hz, e.g. an actual frequency of 16,383 hz will have serious consequences on the performance of the overall time-keeping apparatus. Since there are 86,400 seconds in one day, the error will amount to $(86,400/16,384)\approx5.3$ seconds/day. Such an error is totally unacceptable.

The invention provides logic circuitry by means of which, during a predetermined period of time and at a predetermined rate of repetition one of the divider stages is by-passed thereby effectively doubling the oscillator frequency during the aforesaid predetermined period of time. Thus the output from the last divider stage is fed into the correction control circuit 14 in order to determine a repetition rate. An intermediate output of the chain of dividers is also fed into the correction control circuit to determine the period during which the bypass will be effective at each repetition.

Thus if we assume that the correction control circuit will be operated at 4 second intervals and that at each operation switches S1 and S2 are reversed during a period of four oscillations from oscillator 10, then during the course of 24 hours the effect will be that of adding in (86,400/4) × 2 oscillations during the 24 hour period which is equal to a correction of (43,200/16,384)≈2.64 seconds per day. If the repetition rate of the correction were to be doubled then the effective correction would amount to ≈5.3 seconds per day, sufficient to correct a crystal oscillating at 1 hz below the design frequency. In practice crystals can be cut to closer tolerances than this so that satisfactory results may be achieved with correction steps amounting to 1.32 seconds/day with remaining corrections being obtained by means of a trimmer condenser.

Figure 2:
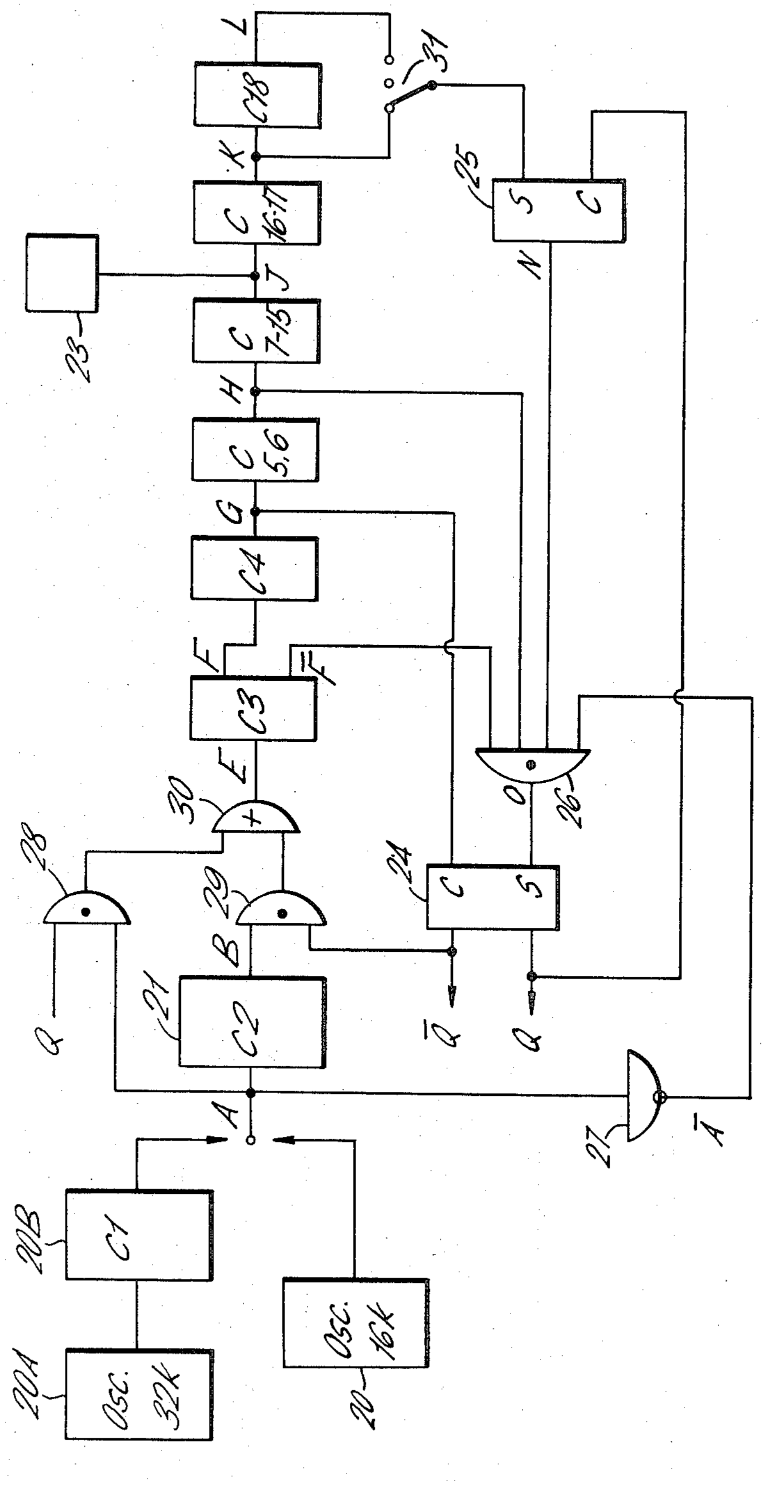
FIG. 2 is a block diagram showing in detail the logic which may be employed in an actual realization of the invention.

One possible realization of the principle shown by the logic diagram of FIG. 1 is shown in FIG. 2. Other specific forms may readily occur to those skilled in the art having regard to the state of technology as applied to realization of the various logic items shown.

As in FIG. 1 an oscillator 20 feeds its output to a chain of binary counter or divider stages. An alternate arrangement is shown in the form of oscillator 20A connected into the chain via counter stage 20B, and such an arrangement could be used with a crystal controlled oscillator having double the nominal frequency of 16,384 hz. The first regular divider stage 21 has its output connected via AND gate 29 and OR gate 30 to the chain of dividers, shown in some cases individually and in some collectively as dividers C3 to C15. Bypass AND gate 28 couples the oscillator to divider stage C3 via OR gate 30. The oscillator output is also connected through an inverter 27 to a timing AND gate 26. The output of divider stage C15 is connected to the display unit 23 and to further divider stages C16, C17 and C18.

It is to be noted that all divider stages, which may take the form of bistable flip-flops, are capacitively interconnected, whereas the gating devices are directly connected. Thus a change in state of a given stage will only be sensed by the following stage during the time it is actually taking place.

Stages C16, C17 and C18, flip-flop 25, AND gate 26 and flip-flop 24 correspond to the correction control circuit 14 of FIG. 1. Thus if the output at J of stage C15 is 1 hz then the output of stage C17 will be ¼ hz and the output of C18 will be ⅛ hz. This latter as previously explained corresponds to a correction of 1.32 seconds/day.

A selector switch 31 is provided to enable a choice of no correction, a correction of 1.32 seconds/day and a correction of 2.65 seconds/day. The switch is connected to the SET input of flip-flop 25 via a capacitive coupling. The output of flip-flop 25 is connected to one input of timing AND gate 26. Other inputs of AND gate 26 are obtained from the outputs of stages C3 (complement), C6 and as mentioned the inverted output from the oscillator.

It is to be noted that in view of the desire to conserve power the current is limited as one progresses down the chain of divider stages. Accordingly the delay time for the setting of each stage progressively increases. For this reason the timing AND gate 26 has been found to be desirable. However, with continuing improvements expected in the technology in integrated circuits it is quite possible that this gate might be eliminated in another embodiment. A somewhat different pattern of inputs could also be provided for this gate, the criterion being simply that the flip-flop 24 whose SET input received the output of AND gate 26, triggers during a time period when Signal A is in the low state, thereby to avoid spurious signals. Flip-flop 24 receives a CLEAR input from the output of divider stage C4 and its output pattern may be observed from graphs Q and $\overline{Q}$ shown by FIG. 3.

The SET output Q of flip-flop 24 provides an enabling signal to bypass AND gate 28 and a CLEAR signal to flip-flop 25. The CLEAR output $\overline{Q}$ of flip-flop 24 provides an enabling signal to AND gate 29 so that as long as flip-flop 24 is CLEAR the output from the oscillator passes by way of divider stage C2 (21), AND gate 29, and OR gate 30 to divider stage C3.

Figure 3:
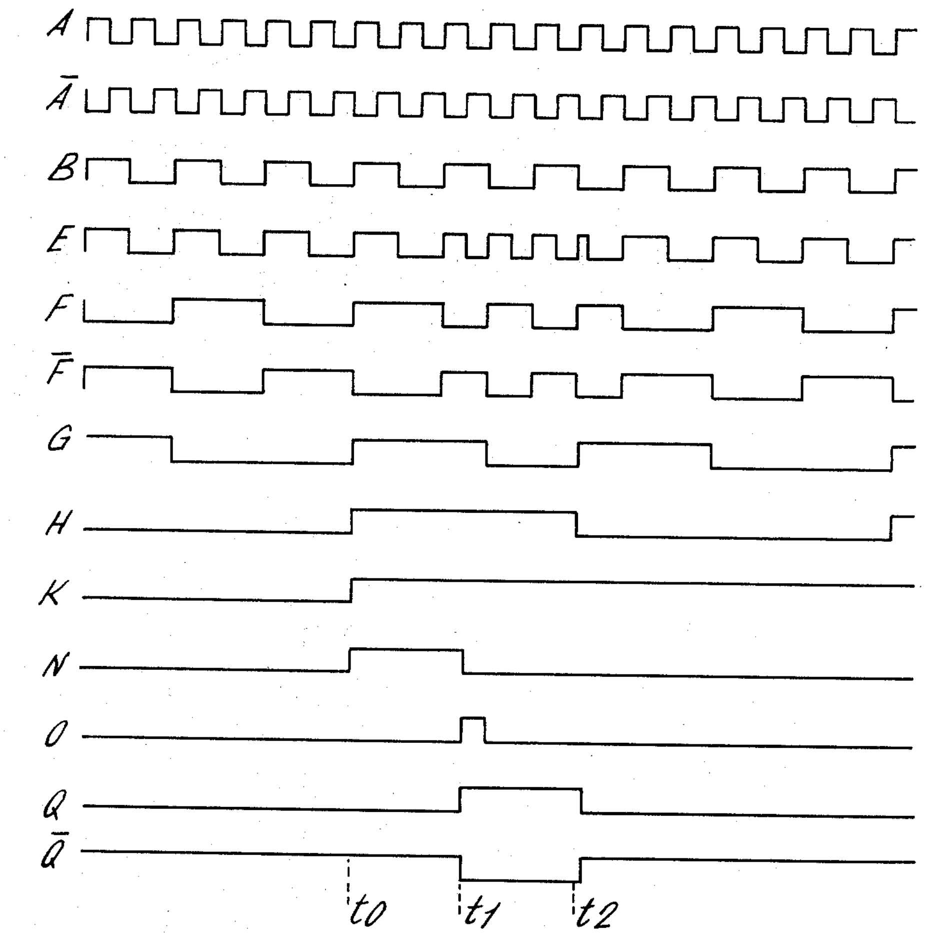
FIG. 3 is a timing diagram of the operation of the FIG. 2 logic.

The operation of the FIG. 2 arrangement may best be understood by reference to the timing as shown by FIG. 3. To simplify the presentation, the progressively increasing delays for the setting of the divider stages are not shown.

Graph A represents the oscillator output and $\overline{A}$ represents its complement as applied to AND gate 26. Graph B represents the output of stage C2. Other graphs are lettered to show the output at the correspondingly lettered points in FIG. 2. It is assumed that flip-flop 25 is SET at time $t_0$ as shown. At time $t_1$ a coincidence of high signals occurs at the input to AND gate 26 which thereupon provides an output as shown in graph 0 to SET flip-flop 24. This in turn provides an enabling signal Q to AND gate 28 until time $t_2$ at which it is CLEARED by signal G coming from stage C4.

During the time that AND gate 28 is enabled, signals from the oscillator are transmitted directly to divider stage C3 while the output of stage C2 is blocked by the disabled condition of AND gate 29. Graph E shows that four pulses are sent down the chain during a time interval normally serving for two. (Compare Graph B)

The effect is transmitted down the entire chain and the effect is a slight shortening of intervals between pulses at the display unit 23 - sufficient to increase the effective daily rate of 1.32 or 2.65 seconds according to whether switch 31 connects C18 (L) or C17 (K) to flip-flop 25.

Although the switches S1 and S2 of FIG. 1 are depicted in FIG. 2 as comprising logical AND gates 28 and 29 respectively, the invention should not be construed as limited to any specific realization of these elements and the concepts taught hereby may be applied as best adapted to the requirements, and in order to draw maximum advantage of modern technologies such as those relating to integrated circuits.

I claim:

1. In a pulse generator comprising an oscillator circuit the output of which is coupled to a chain of successive frequency divider stages, thereby to obtain output pulses at a desired frequency lower than the oscillator frequency, the improvement comprising a normally disabled bypass circuit bypassing at least one of said divider stages, control means for enabling said bypass circuit and for concurrently disabling the coupling of the bypassed divider stage to the later stages in the chain, and means for connecting the output of at least one divider stage later in the chain than said bypassed stage to said control means at preselected time intervals, thereby enabling said control means to periodically remove said bypassed stage from the chain and to temporarily increase the output frequency of the chain.

2. A pulse generator as claimed in claim 1 wherein the bypass circuit includes a plurality of logic gates and wherein a bistable circuit provides enabling signals of predetermined duration to the logic gates.

3. A pulse generator as claimed in claim 2 including coincidence means responsive to a signal from the oscillator circuit, a signal from a divider stage late in the chain, and signals from two different divider stages intermediate in the chain for generating a SET signal for said bistable circuit, and in which said bistable circuit is CLEARED by a signal from an intermediate divider stage, to thereby determine the timing and duration of said enabling signals.

4. A pulse generator as claimed in claim 1 wherein each divider stages comprise a binary counter whereby at the output of each stage the frequency is half that of the immediately preceding stage.

5. A pulse generator as claimed in claim 1 wherein the oscillator circuit includes a controlling quartz crystal adjusted to vibrate at a frequency slightly below a predetermined frequency whereby the increase of output frequency effected by the bypass circuit provides compensation for the difference between the actual frequency and said predetermined frequency.

6. A pulse generator as claimed in claim 1 wherein the output pulses are adapted to provide timing signals for the display unit of horological apparatus.

7. A pulse generator as claimed in claim 6 wherein the horological apparatus comprises a wrist-watch.

8. A pulse generator as claimed in claim 1, including means responsive to the rate of change of state of at least one divider stage late in the chain for determining said time intervals.

9. A pulse generator as claimed in claim 1, including at least one additional divider stage connected in serial arrangement in the chain beyond the normal output stage of the pulse generator, and means responsive to the rate of change of state of at least one additional divider stage for determining said time intervals.

10. A pulse generator as claimed in claim 1, including means responsive alternatively to the rate of change of state of one of a plurality of divider stages late in the chain for determining said time intervals and a selector switch for connecting the output of a selected one of said plurality of stages to said control means.

* * * * *